United States Patent [19]

Bobb

[11] Patent Number: 4,918,371

[45] Date of Patent: Apr. 17, 1990

[54] FIBER OPTIC MAGNETOMETERS FOR MULTIPLE ORDER GRADIOMETERS

[75] Inventor: Lloyd C. Bobb, Warminster, Pa.

[73] Assignee: The United States of America as represented by the Secretary of the Navy, Washington, D.C.

[21] Appl. No.: 208,931

[22] Filed: Jun. 20, 1988

[51] Int. Cl.[4] .................... G01R 33/22; G01R 33/23; G01B 9/02

[52] U.S. Cl. .................... 324/244; 324/260; 250/227.19; 350/376

[58] Field of Search .................... 324/244, 260, 96; 350/376; 250/227

[56] References Cited

U.S. PATENT DOCUMENTS

| | | |
|---|---|---|
| 2,485,847 | 10/1949 | Scmitt . |
| 3,341,772 | 9/1967 | Weiss . |
| 4,356,448 | 10/1982 | Brogardh et al. . |
| 4,376,248 | 3/1983 | Giallorenzi et al. . |
| 4,386,318 | 5/1983 | Burbank et al. . |
| 4,433,291 | 2/1984 | Yariv et al. . |
| 4,644,273 | 2/1987 | Bobb .................... 324/244 |
| 4,814,706 | 3/1989 | Rempt .................... 324/244 |

Primary Examiner—Reinhard J. Eisenzopf
Assistant Examiner—Walter E. Snow
Attorney, Agent, or Firm—Susan E. Verona; James B. Bechtel; James V. Tura

[57] ABSTRACT

Magnetometers disposed as magnetostrictive segments on optical fiber elements are incorporated in multiple order gradiometers to reduce the size, weight and cost thereof. In the preferred embodiments, such reductions are greatly enhanced by consolidating a plurality of magnetometers on individual optical fiber elements, which also serves to decrease the number of devices associated with the magnetometers in the multiple order gradiometers.

9 Claims, 4 Drawing Sheets

FIBER OPTIC MAGNETOMETERS FOR MULTIPLE ORDER GRADIOMETERS

STATEMENT OF GOVERNMENT INTEREST

The invention described herein may be manufactured and used by or for the Government of the United States of America for governmental purposes without the payment of any royalities thereon or therefor.

BACKGROUND OF THE INVENTION

The present invention relates generally to multiple order gradiometers and more particularly, to such gradiometers which have heavy, bulky and costly components associated therewith.

Magnetic fields are commonly measured using either a magnetometer or a gradiometer. A magnetometer is an instrument which measures magnetic field intensity in direct proportion to the sensitivity of a single sensing element and therefore, provides no magnetic field background or noise rejection. Various types of magnetometers are known, such as those which utilize moving and stationary coils, Hall Effect Devices, thin films, fluxgates, magnetic resonance devices, superconducting devices and as disclosed in U.S. Pat. No. 4,433,291, a magnetostrictive segment on an optical fiber element. A gradiometer is an instrument which measures the difference between the magnetic field intensities at two separate locations, with at least one pair of magnetometers. Therefore gradiometers provide common made background or noise rejection which can be enhanced by increasing the number of magnetometer pairs to increase the order of the gradiometer.

Although multiple order gradiometers which utilize various types of magnetometers are known in the art, where extreme sensitivity is required superconducting quantum interference devices (SQUIDs) are commonly utilized therein. Because such gradiometers must be cooled to cryogenic temperatures, such as with liquid helium, the applications therefor are severely limited due to the greater size, weight and expense thereof. Furthermore, where applications do exist for such gradiometers, difficulties are encountered therewith in regard to balancing and trimming, which is usually only accomplished by successive approximations. Magnetostrictive segments on optical fiber elements have been utilized in first order gradiometers to overcome the problems encountered with SQUIDs, as disclosed in my U.S. Pat. No. 4,644,273.

SUMMARY OF THE INVENTION

It is the general object of the present invention to decrease the size, weight and expense of multiple order gradiometers, while facilitating the balancing and trimming thereof.

In accordance with the above stated general object, it is a specific object of the present invention to provide multiple order gradiometers which operate at ambient temperatures.

Another specific object in accordance with the above stated general object, is to structurally consolidate a plurality of magnetometers within multiple order gradiometers.

These and other objects are accomplished in accordance with the present invention by utilizing at least one magnetostrictive segment on optical fiber elements for each magnetometer required in a multiple order gradiometer. Structural consolidation of such magnetometers is accomplished by integrating a plurality of magnetostrictive segments on the same optical fiber elements.

The scope of the present invention is only limited by the appended claims for which support is predicated on the preferred embodiments hereinafter set forth in the following description and the attached drawings wherein like reference characters refer to like parts throughout the several figures.

DESCRIPTION OF THE PREFERRED EMBODIMENTS

Figure 1:
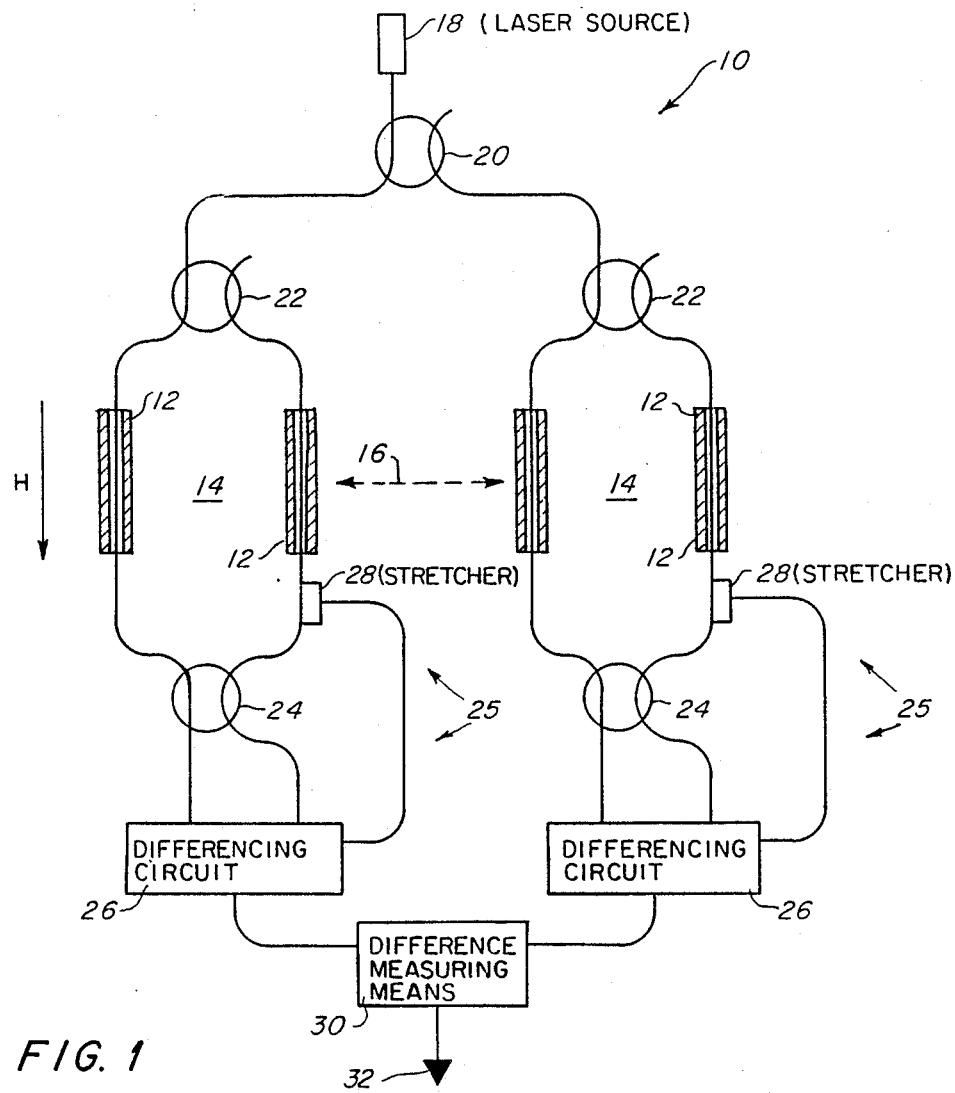
FIG. 1 illustrates one preferred embodiment of the present invention wherein magnetostrictive optical fiber elements serving as magnetometers, are arranged to provide a second order gradiometer.

One preferred embodiment of the invention is illustrated in FIG. 1 wherein a multiple or higher order gradiometer 10 is shown to have a plurality of magnetometers 12 arranged in pairs 14 to detect a second order gradient. Each magnetometer 12 is a magnetostrictive segment on an optical fiber element and is longitudinally disposed across an axis 16 passing through a magnetic field H, adjacent to at least one other magnetometer 12. Optical fiber elements having a single magnetostrictive segment disposed thereon are well known, as discussed extensively in my U.S. Pat. No. 4,644,273. Such elements need only include magnetostrictive material which is arranged to induce strain in the optical fiber of a magnitude that varies in accordance with, the intensity of the magnetic field H.

Each magnetometer pair 14 in FIG. 1 is conventionally arranged and connected to measure the field inftensity H at a location along the axis 16 with the well known quadrature phasing technique that is utilized in Mach-Zehnder and other types of interferometers. A single frequency laser source 18 directs light through a primary splitter 20 to secondary splitters 22, each of which distributes light beams of equal intensity to each magnetometer 12 in one of the magnetometer pairs 14. Separate beams of light depart from the magnetometers 12 in each magnetometer pair 14 and pass through a combiner 24 which passes those beams on to a field appraisal means 25 for maintaining quadrature and measuring the difference between the field intensities H which are sensed by the magnetometers 12. An initial differencing circuit 26 is disposed in each means 25 and of course, includes a means (not shown) for translating each light beam into an electrical signal, such as a photodiode. Of course, any conventional means can be utilized to provide the differencing function, such as an operational amplifier arranged to subtract the signal outputs from the photodiodes. A conventionally known control means is also included in each differencing circuit 26 for feeding back a phase modulating signal to a stretcher 28 which maintains the quadrature relationship between the light beams which pass through each combiner 24. Because of this quadrature relationship, each field appraisal means 25 produces an output which passes from the differencing circuit 26 and is equivalent to the first order gradient of the magnetic field H. These outputs from the field appraisal means 25 are directed to a means 30 for progressively measuring the difference between pairs of such outputs until a final output 32 is attained having the desired gradient order magnitude. As is well known by those skilled in the art of gradiometers, the number of field appraisal means 25 doubles for each numeric increase in the gradient order magnitude and therefore, the multiple order gradiometer 10 of FIG. 1 measures the magnetic field H as a second order gradientd. It should also be appreciated by those skilled in the art that in higher order gradiometers which are arranged in the manner illustrated by FIG. 1, the difference measuring means 30 will be a ladder structure of differencing circuits which progressively decrease in number by fifty percent at each ladder step until the final output 32 is derived from one last differencing circuit.

Due to the very compact nature thereof, many more magnetostrictive optical fiber elements than are shown in FIG. 1 can be arranged in a reasonably compact multiple order gradiometer 10 of the invention. Also, the substantially perpendicular orientation of the axis 16 relative to the magnetic field H in FIG. 1 is not a limitation and the desired orientation thereof may be made to suit the application of the multiple order gradiometer 10. Furthermore, even though the magnetometers 12 are shown to be adjacently disposed longitudinally across the axis 16 in FIG. 1, for many applications it would be preferable to adjacently dispose the magnetometers 12 longitudinally in tandem, collinearly in the direction of the magnetic field H.

Figure 2A:
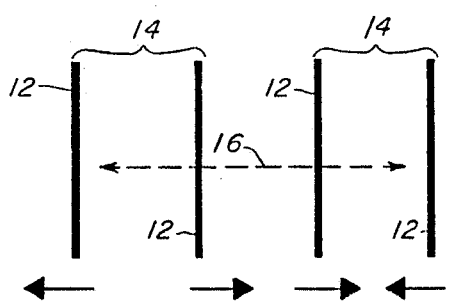
FIG. 2(a) is an electrically unconnected bar schematic of the magnetometers in the FIG. 1 gradiometer.

A bar schematic representing the physical arrangement of the magnetometers 12 and the effective polarity thereof in the multiple order gradiometer 10 of FIG. 1, is illustrated by FIG. 2(a). Of course, the magnetometers 12 are adjacently disposed, longitudinally across the axis 16 and in each magnetometer pair 14, one magnetometer 12 makes a positive contribution (arrowhead facing left) to the final output 32 of the multiple order gradiometer 10 and the other magnetometer 12 makes a negative contribution (arrowhead facing right) thereto. However, the effective polarity of the contribution to the final output 32 by the comparably positioned magnetometers 12 in the magnetometer pairs 14 is reversed, because the final output 32 is the result of a second order differential.

Figure 2B:
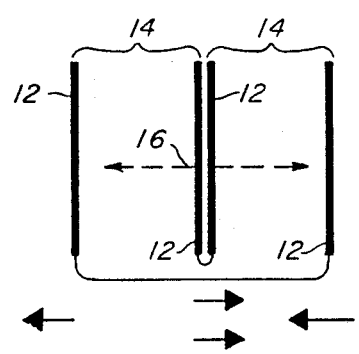
FIG. 2(b) is a bar schematic for another second order gradiometer which illustrates how pluralities of magnetometers therein can be consolidated on optical fiber elements relative to the FIG. 2(a) bar schematic.
Figure 3:
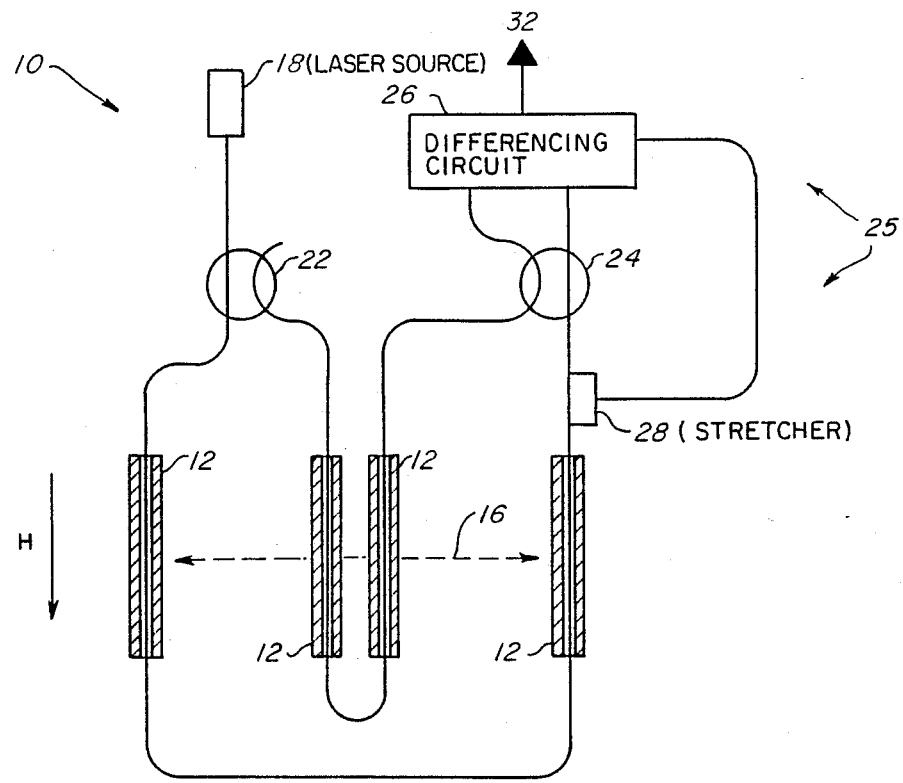
FIG. 3 illustrates a second order gradiometer with the consolidated arrangement of magnetometers from FIG. 2(b) incorporated therein.

The construction generally of multiple order gradiometers 10 can be greatly simplified to further reduce the size, weight and cost thereof, by arranging those magnetometers 12 therein which have the same effective polarity in at least two magnetometer pairs 14 on the same optical fiber elements. For the multiple order gradiometer 10 of FIG. 1, the magnetometers 12 having the same effective polarity in the two magnetometer pairs 14 illustrated by the bar schematic of FIG. 2(a), are so arranged in the bar schematic of FIG. 2(b). The distance separating the magnetometers 12 on each optical fiber element may vary depending on the baseline separation between the magnetometers 12 in the multiple order gradiometer 10. For each optical fiber element in the bar schematic of FIG. 2(b), a summation process inherently occurs therein relative to the contributions made by the plurality of magnetometers 12 disposed thereon. This summation process allows for the multiple order gradiometer 10 of FIG. 1 to be greatly simplified, as shown in FIG. 3 by eliminating the primary splitter 20 and the difference measuring means 30. Furthermore, it should be understood from a comparison of FIGS. 1 and 3 that the number of secondary splitters 22, combiners 24, initial differencing circuits 26 and stretchers 28 in the multiple order gradiometer 10 is decreased by one for each additional magnetometer 12 which is disposed on the optical fiber elements.

Figure 4A:
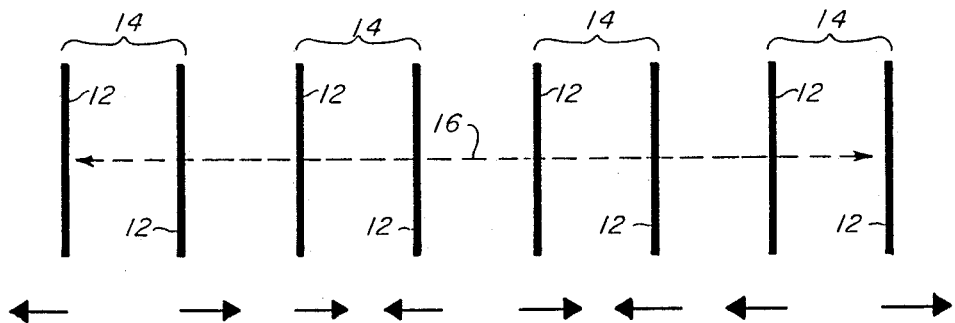
FIG. 4(a) is an electrically unconnected bar schematic of the magnetometers in a third order gradiometer for still another preferred embodiment of the invention.

Of course, the number of magnetometers 12 required in any multiple order gradiometer 10 is dependent on the gradient order magnitude to be attained thereby. Although theoretical considerations strongly support the conclusion that the number of magnetometers 12 in any multiple order gradiometer 10 may be reduced in number, for the present state of the art this number doubles for each numeric increase in the gradient order magnitude. Consequently, a second order gradiometer includes four magnetometers 12, as shown in FIGS. 1, 2(a and b) and 3, while a third ordder gradiometer includes eight magnetometers 12, as shown in FIGS. 4(a, b and c) and 5. The eight magnetometers 12 in the third order gradiometer may each be disposed on an individual optical fiber element, as shown in the bar schematic of FIG. 4(a), where the magnetometers 12 are arranged in magnetometer pairs 14 to provide a direct analogy with the magnetometers 12 in the bar schematic of FIG. 2(a). Consequently, as was the case in regard to the second order gradiometer of FIG. 1 to which FIG. 2(a) relates, light departing from the magnetometers 12 in each magnetometer pair 14 of the bar schematic in FIG. 4(a) will pass through a combiner 24 to a field appraisal means 25. Of course, an initial differencing circuit 26, and stretcher 28 is combined in each field appraisal means 25. Also, a more complex primary splitter 20 will be required for directing the light from the source 18 to the increased number of secondary splitters 22. Furthermore, the difference measuring means 30 will be a two step ladder structure having two differencing circuits in the first step and one differencing circuit in the second step, with the final output 32 being derived from the latter.

As was explained previously in regard to FIG. 2(b), the construction of multiple order gradiometers 10 is greatly simplified to further reduce the size, weight and cost thereof, by arranging those magnetometers 12 of the same effective polarity in at least two magnetometer pairs 14 on the same optical fiber elements. Of course, the construction of the multiple order gradiometer 10 to which the bar schematic of FIG. 4(a) relates would be somewhat simplified by so arranging the magnetometers 12 in only two magnetometer pairs 14. In such an arrangement, the number of splitters 22, combiners 24, initial differencing circuit 26 and stretcher 28 combinations, as well as the differencing circuits at each step in the ladder structure of the difference measuring means 30 is reduced by one. This simplification is analogous to that accomplished for the multiple order gradiometer 10 of FIG. 1 by consolidating the arrangement of optical fiber elements in FIG. 2(a) as shown in FIG. 2(b), to derive the multiple order gradiometer 10 of FIG. 3.

Figure 4B:
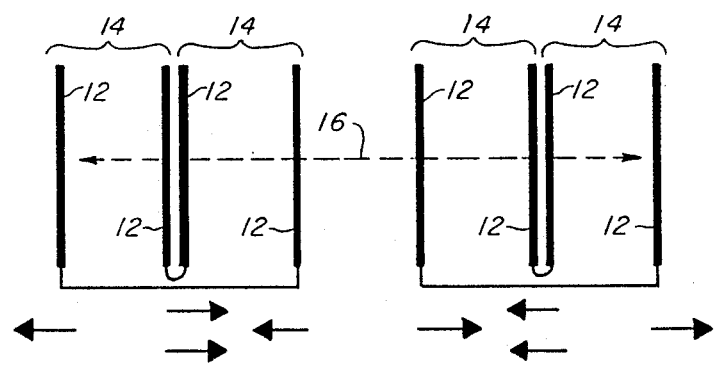
FIG. 4(b) is a bar schematic for another third order gradiometer which illustrates how pluralities of magnetometers therein can be consolidated on optical fiber elements relative to the FIG. 4(a) bar schematic.

Other more practical approaches to simplifying the construction of multiple order gradiometers 10 are possible, such as to consolidate the FIG. 4(a) arrangement of optical fiber elements in the manner illustrated by the FIG. 4(b) arrangement, wherein each such optical fiber element has a plurality of magnetometers 12 disposed thereon. In FIG. 4(b) each optical fiber element includes two magnetometers 12, having outputs of the same effective polarity which are to be summed. It should be noted by comparison that in FIG. 4(a) two optical fiber elements are required for each magnetometer pair 14 whereas in FIG. 4(b) only two optical fiber elements are required for each two magnetometer pairs 14. Consequently, the total number of optical fiber elements in the FIG. 4(b) arrangement is equal to half the total number of magnetometers 12 in the multiple order gradiometer 10 to which that arrangement relates, and this is also true in regard to the FIG. 2(b) arrangement. Furthermore, only half the number of splitters 22, combiners 24, initial differencing circuit 26 and stretcher 28 combinations, as well as steps in the ladder structure of the difference measuring means 30, are required for the multiple order gradiometer 10 having the FIG. 4(b) arrangement, as are required for the multiple order gradiometer 10 having the FIG. 4(a) arrangement. This is so because each pair of optical fiber elements in FIG. 4(b) includes magnetometers 12 from two magnetometer pairs 14 of the FIG. 4(a) arrangement.

Figure 4C:
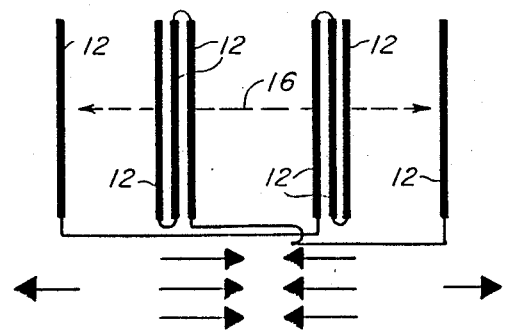
FIG. 4(c) is a bar schematic for still another third order gradiometer which illustrates how pluralities of magnetometers therein can be consolidated further on optical fiber elements.
Figure 5:
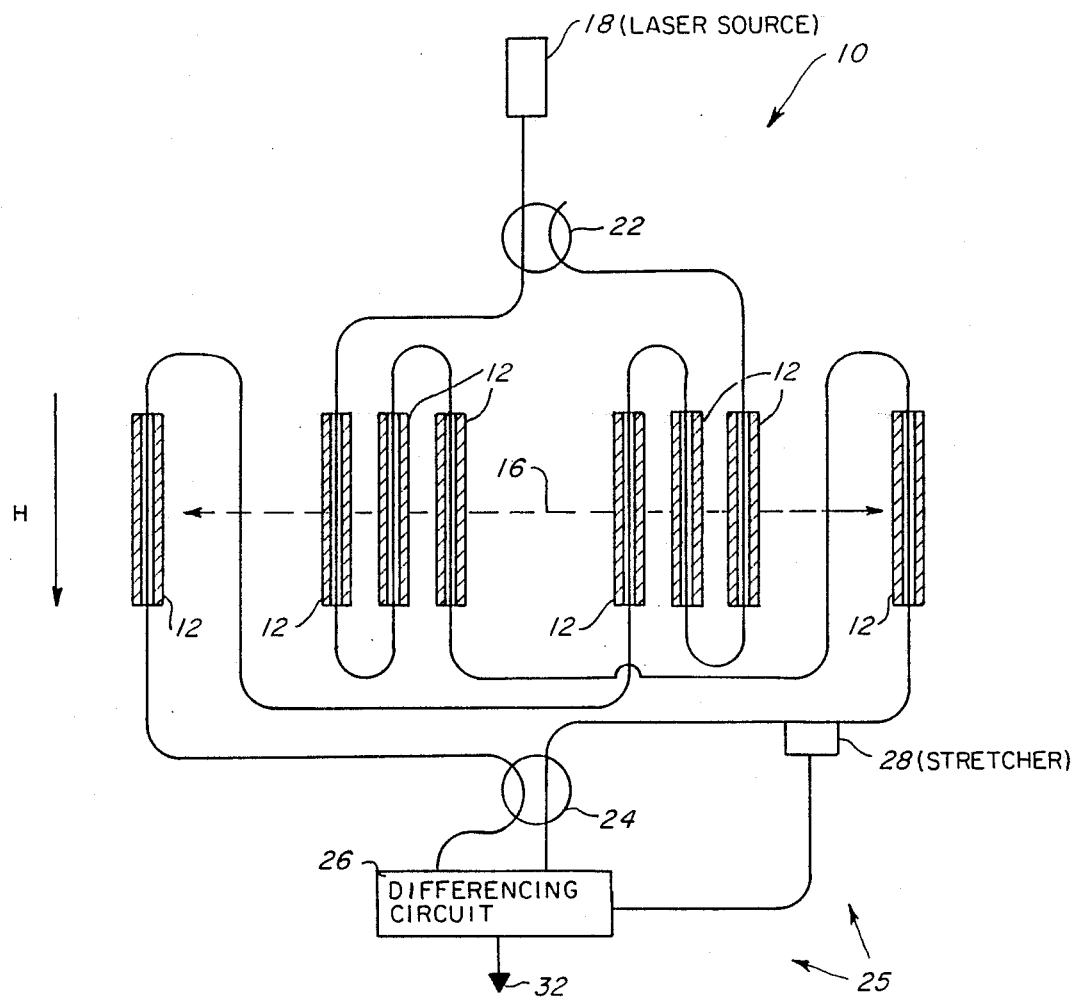
FIG. 5 illustrates a third order gradiometer with the consolidated arrangement of magnetometers from FIG. 4(c) incorporated therein.

As shown in FIG. 4(c), the arrangement of optical fiber elements in a third order gradiometer can be consolidated still further than is illustrated in FIG. 4(b), by disposing all the magnetometers 12 on a single pair of optical fiber elements. In the FIG. 4(c) arrangement, all of the magnetometers 12 of each effective polarity are disposed on a single optical fiber, so that one half of the magnetometers 12 in the multiple order gradiometer 10 are disposed on one optical fiber element, while the other half of the magnetometers 12 are disposed on another optical fiber element. Because this arrangement includes only one pair of optical fiber elements, only one splitter 22, combiner 24, initial differencing circuit 26 and stretcher 28 combination is required therefor in the multiple order gradiometer 10, as shown in FIG. 5 for the third order gradiometer to which the FIG. 4(c) arrangement applies. Furthermore, no difference measuring means 30 is required therein.

Those skilled in the art will appreciate without any further explanation that many modifications and variations are possible to the above disclosed multiple order gradiometer embodiments within the concept of this invention. Consequently, it should be understood that all such modifications and variations fall within the scope of the following claims.

What I claim is:

1. In a magnetic field gradiometer of the type wherein magnetometers are arranged in a plurality of pairs to detect a multiple order gradient, the improvement comprising:
    each said magnetometer is a magnetostrictive segment on an optical fiber element and said magnetometers of opposite effective polarities are arranged in each said pair and said magnetometers of the same effective polarity in at least two of said pairs are disposed on the same optical fiber element.

2. The gradiometer of claim 1 wherein the number of optical fiber elements having a plurality of said magnetometers disposed thereon is half the total number of said magnetometers in said gradiometer.

3. The gradiometer of claim 1 wherein only two optical fiber elements are disposed in said gradiometer with each optical fiber element having all said magnetometers of one effective polarity disposed thereon.

4. A magnetic field gradiometer comprising:
    magnetometers arranged in a plurality of pairs to detect a multiple order gradient, with each said magnetometer being a magnetostrictive segment on an optical fiber element;
    a field appraisal means connected to each magnetometer pair for maintaining quadrature and measuring the output difference therebetween to produce a first order gradient output relative to the magnetic field; and
    means for progressively measuring the difference between pairs of said first order gradient outputs until a final output is attained having the desired gradient order magnitude.

5. The gradiometer of claim 4 wherein each field appraisal means comprises:
    a stretcher for maintaining a quadrature relationship between the magnetometer outputs associated with said field appraisal means; and
    an initial differencing circuit for deriving a first order gradient output from between the magnetometer outputs associated with said field appraisal means.

6. The gradiometer of claim 4 wherein said difference measuring means comprises:
    a ladder structure of differencing circuits which progressively decrease in number by fifty percent at each ladder step until the final output is derived from one last differencing circuit.

7. The gradiometer of claim 4 wherein said magnetometers of opposite effective polarities are arranged in each said pair and said magnetometers of the same effective polarity in at least two of said pairs are disposed on the same optical fiber element.

8. The gradiometer of claim 7 wherein the number of optical fiber elements having a plurality of said magnetometers disposed thereon is half the total number of said magnetometers in said gradiometer.

9. The gradiometer of claim 7 wherein only two optical fiber elements are disposed in said gradiometer with each optical fiber element having all said magnetometers of one effective polarity disposed thereon.

* * * * *